(12) United States Patent
Park

(10) Patent No.: US 9,373,385 B2
(45) Date of Patent: Jun. 21, 2016

(54) SEMICONDUCTOR MEMORY AND METHOD FOR OPERATING THE SAME

(71) Applicant: SK hynix Inc., Gyeonggi-do (KR)

(72) Inventor: Byoung-Kwon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/490,354

(22) Filed: Sep. 18, 2014

(65) Prior Publication Data

US 2015/0279443 A1 Oct. 1, 2015

(30) Foreign Application Priority Data

Mar. 28, 2014 (KR) .................. 10-2014-0036528

(51) Int. Cl.
| | |
|---|---|
| *G11C 11/406* | (2006.01) |
| *G11C 11/4076* | (2006.01) |
| *G11C 29/02* | (2006.01) |
| *G11C 8/12* | (2006.01) |
| *G11C 29/50* | (2006.01) |

(52) U.S. Cl.
CPC .......... *G11C 11/406* (2013.01); *G11C 11/4076* (2013.01); *G11C 11/40618* (2013.01); *G11C 29/023* (2013.01); *G11C 29/028* (2013.01); *G11C 8/12* (2013.01); *G11C 29/50016* (2013.01)

(58) Field of Classification Search
None
See application file for complete search history.

(56) References Cited

U.S. PATENT DOCUMENTS 6,438,062 B1 * 8/2002 Curtis .................. G11C 7/1018
365/230.01

FOREIGN PATENT DOCUMENTS

KR  1020110025338  3/2011

* cited by examiner

*Primary Examiner* — James G Norman
(74) *Attorney, Agent, or Firm* — IP & T Group LLP

(57) ABSTRACT

A semiconductor memory may include: a bank control signal generation unit suitable for sequentially generating a plurality of bank control signals for controlling a memory bank based on an active command, a signal detection unit suitable for detecting a firstly activated signal and a lastly activated signal among the bank control signals, and a bank enable control unit suitable for controlling an active period of the memory bank in response to the detected signals.

16 Claims, 3 Drawing Sheets

US 9,373,385 B2

SEMICONDUCTOR MEMORY AND METHOD FOR OPERATING THE SAME

CROSS-REFERENCE TO RELATED APPLICATIONS

The present application claims priority of Korean Patent Application No. 10-2014-0036528, filed on Mar. 28, 2014, which is incorporated herein by reference in its entirety.

BACKGROUND

1. Field

Various embodiments of the present invention relate to a semiconductor design technology and, more particularly, to a semiconductor memory that performs a refresh operation.

2. Description of the Related Art

With the increase in integration degree of semiconductor memory, the interval between word lines in the semiconductor memory has been reduced. The reduced interval between the word lines may cause an increase in coupling effects between adjacent word lines.

In general, whenever data is inputted to or outputted from a memory cell in a semiconductor memory, a word line connected to the memory cell toggles between an active state (an active operation) and an inactive state (a precharge operation). Due to the coupling phenomenon, voltage levels of adjacent word lines may be destabilized by repeated activations/deactivations of word lines that are being read or programmed. The destabilized voltage levels may result in data of memory cells coupled to the adjacent word lines being lost or damaged. This phenomenon is referred to as word line disturbance (or word line hammering). If the word line disturbance is bad enough, the data of memory cells may be lost before the memory cells are refreshed.

To resolve this concern, a target row refresh (TRR) operation may be performed. The TRR operation is performed to prevent the degradation in cell characteristics of memory cells couple to word lines that are adjacent to highly active word lines. Active and precharge operations (i.e., a TRR operation) are performed on a target word line corresponding to a frequently activated word line and adjacent word lines. The TRR operation may refresh the degraded cell data to retain memory cell charges at normal data levels.

SUMMARY

Various embodiments are directed to a semiconductor memory capable of controlling a memory bank according to PVT (process, voltage, and temperature) variations.

In an embodiment, a semiconductor memory may include: a bank control signal generation unit suitable for sequentially generating a plurality of bank control signals for controlling a memory bank based on an active command; signal detection unit suitable for detecting a firstly activated signal and a lastly activated signal among the bank control signals; and a bank enable control unit suitable for controlling an active period of the memory bank in response to the detected signals.

In an embodiment, a semiconductor memory may include: a bank control signal generation unit suitable for sequentially generating a plurality of bank control signals for controlling a refresh operation of a memory bank, based on an active command; a signal detection unit suitable for detecting a firstly activated signal and a lastly activated signal among the bank control signals; and a refresh operation control unit suitable for adjusting a refresh operation period in which the refresh operation is performed, in response to the detected signals.

In an embodiment, a method for operating a semiconductor memory may include: sequentially generating a plurality of control signals for controlling a memory bank, based on an active command; generating a set signal in response to a firstly activated signal among the control signals; generating a reset signal in response to a lastly activated signal among the control signals; and controlling the memory bank in response to the control signals during an active period of the memory bank, which is defined by the set signal and the reset signal.

DETAILED DESCRIPTION

Figure 1:
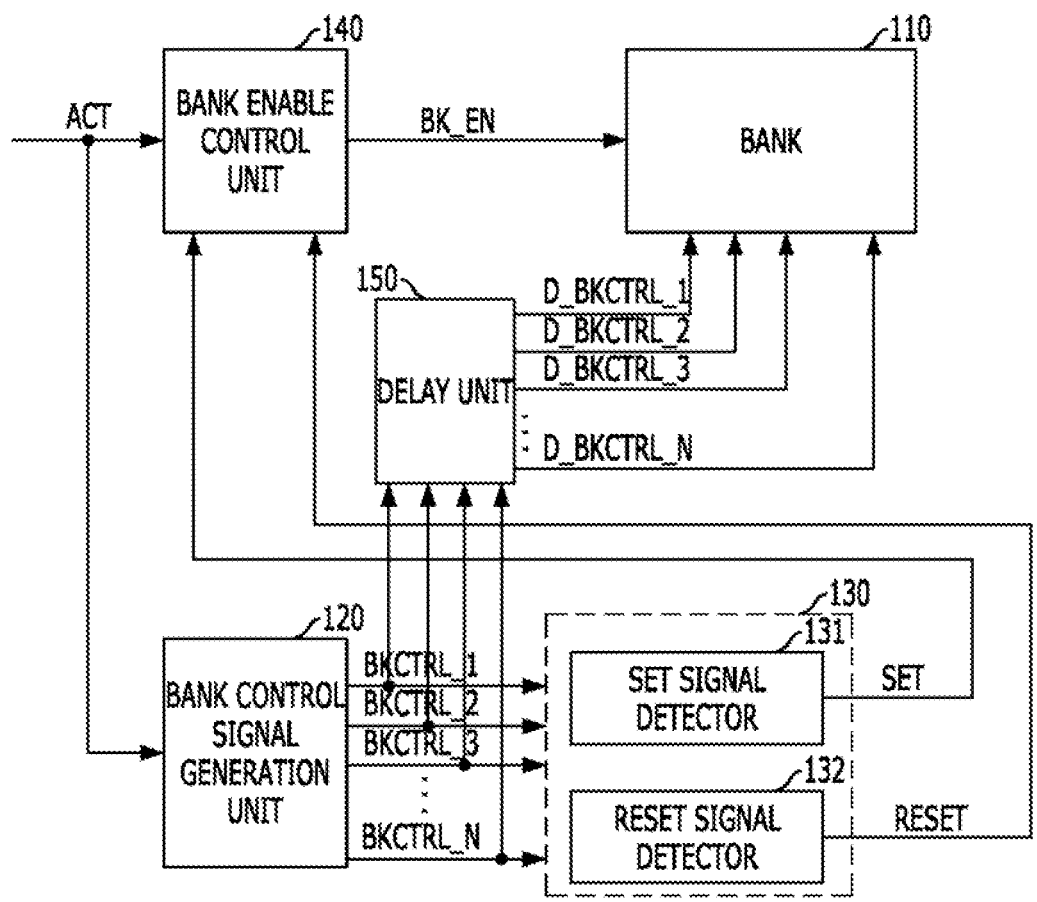
FIG. 1 is a block diagram illustrating a semiconductor memory in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so this disclosure will be thorough and complete, and will fully convey the scope of the present invention to those skilled in the art. Throughout the disclosure, like reference numerals refer to like parts throughout the various figures and embodiments of the present invention.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a block diagram illustrating a semiconductor memory in accordance with an embodiment of the present invention.

Referring to FIG. 1, the semiconductor memory may include a bank a memory bank) 110, a bank control signal generation unit 120, a signal detection unit 130, a bank enable control unit 140, and a delay unit 150.

The bank control signal generation unit 120 may sequentially generate a plurality of bank control signals BKCTRL_1, BKCTRL_2, BKCTRL_3, . . . , BKCTRL_N for controlling the bank 110, in response to an active command ACT. The bank control signals BKCTRL_1, BKCTRL_2, BKCTRL_3, . . . , BKCTRL_N may control the bank 110 during an active period of the bank 110. For example, the bank control signals BKCTRL_1, BKCTRL_2, BKCTRL_3, . . . , BKCTRL_N may include a control signal for selecting a word line of the bank during the active period of the bank 110 or a control signal for operating a sense amplifier. Furthermore, the bank control signals BKCTRL_1, BKCTRL_2, BKCTRL_3, . . . , BKCTRL_N may include a signal for controlling a refresh operation or a signal for controlling a redundancy word line.

The signal detection unit 130 may detect a firstly activated signal and a lastly activated signal among the control signals BKCTRL_1, BKCTRL_2, BKCTRL_3, . . . , BKCTRL_N, which are sequentially activated by the bank control signal generation unit 120. The signal detection unit 130 may include a set signal detector 131 and a reset signal detector 132.

The set signal detector 131 may detect a firstly activated signal among the control signals BKCTRL_1, BKCTRL_2, BKCTRL_3, . . . , BKCTRL_N and output the detected signal as a set signal SET, and the reset signal detector 132 may detect a lastly activated signal among the control signals BKCTRL_1, BKCTRL_2, BKCTRL_3, . . . , BKCTRL_N and output the detected signal as a reset signal RESET. The set signal SET and the reset signal RESET, detected by the signal detector 130, may be inputted to the bank enable control unit 140.

The signal detection unit 130 may be implemented with a combination of various logic circuits such as a logic gate and a transistor. For example, the set signal detector 131 may generate the set signal SET in response to the signal that is firstly activated, using an OR gate. Furthermore, the reset signal detector 132 may generate the reset signal RESET when all signals are activated (i.e., in response to the finally activated signal), using an AND gate and a latch circuit.

The bank enable control unit 140 may generate a bank enable signal BK_EN for controlling activation of the bank 110 in response to the active command ACT. The bank enable signal BK_EN may have an active period, which is adjusted in response to the set signal SET and the reset signal RESET. That is, the bank enable signal BK_EN may be activated in response to the set signal SET, and deactivated in response to the reset signal RESET.

The delay unit 150 may delay the bank control signals BKCTRL_1, BKCTRL_2, BKCTRL_3, . . . , BKCTRL_N generated from the bank control signal generation unit 120 by a predetermined time, and output the delayed signals D_BKCTRL_1, D_BKCTRL_2, D_BKCTRL_3, . . . , D_BKCTRL_N. The delay unit 150 may provide an operation margin for the bank enable signal BK_EN and the bank control signals BKCTRL_1, BKCTRL_2, BKCTRL_3, . . . , BKCTRL_N.

The semiconductor memory in accordance with the embodiment of the present invention may detect a firstly activated signal and a lastly activated signal among the bank control signals BKCTRL_1, BKCTRL_2, BKCTRL_3, . . . , BKCTRL_N, set the active period of the bank enable signal BK_EN, and perform an operation in response to the delayed bank control signals D_BKCTRL_1, D_BKCTRL_2, D_BKCTRL_3, . . . , D_BKCTRL_N, during the active period.

Figure 2:
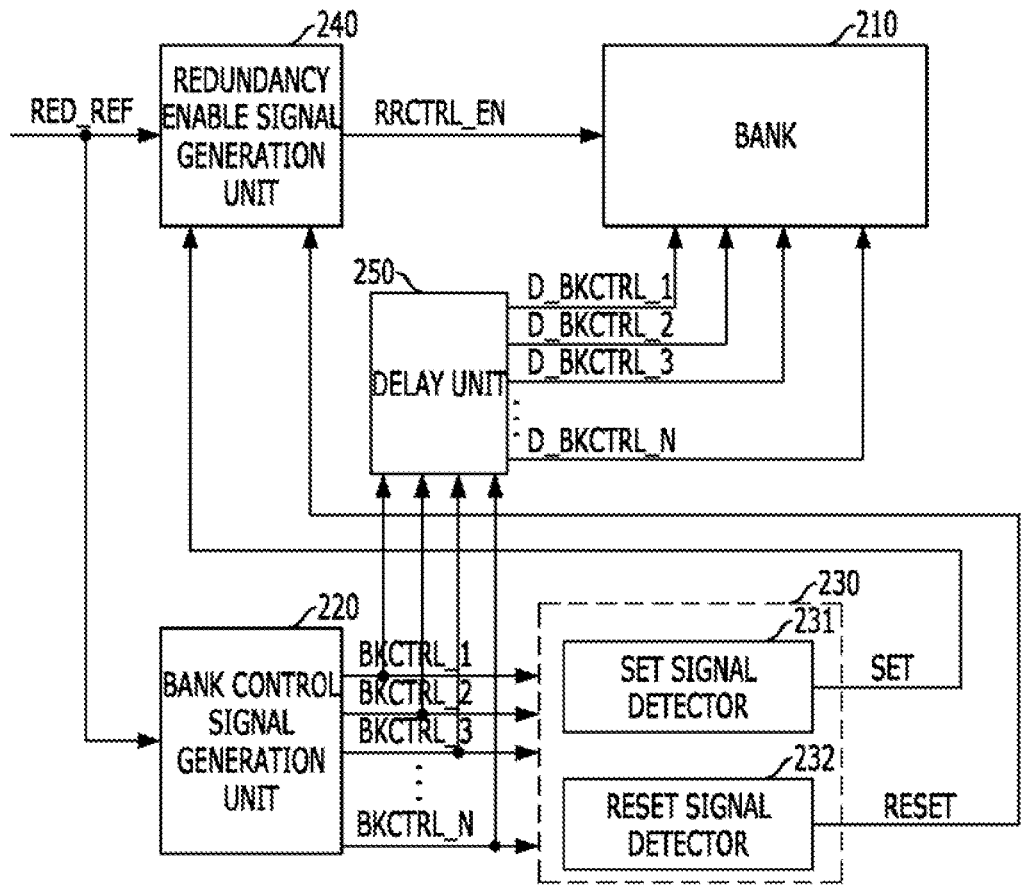
FIG. 2 is a block diagram illustrating a semiconductor memory in accordance with another embodiment of the present invention.

FIG. 2 is a block diagram illustrating a semiconductor memory in accordance with another embodiment of the present invention.

Referring to FIG. 2, the semiconductor memory may include a bank 210, a bank control signal generation unit 220, a signal detection unit 230, a redundancy enable signal generation unit 240, and a delay unit 250.

The bank control signal generation unit 220, the signal detection unit 230, and the delay unit 250 may correspond to the bank control signal generation unit 120, the signal detection unit 130, and the delay unit 150 of FIG. 1, respectively. Furthermore, a set signal detector 231 and a reset signal detector 232 included in the signal detection unit 230 may correspond to the set signal detector 131 and the reset signal detector 132 included in the signal detection unit 130 of FIG. 1, respectively. Thus, the detailed descriptions thereof are omitted.

The redundancy enable signal generation unit 240 may adjust the active period of a redundancy refresh signal RED_REF in response to a set signal SET and a reset signal RESET, generated from the signal detection unit 230. That is, the redundancy refresh signal RED_REF may be activated in response to the set signal SET, and deactivated in response to the reset signal RESET.

The semiconductor memory in accordance with the embodiment of the present invention may detect a firstly activated signal and a lastly activated signal among the control signals BKCTRL_1, BKCTRL_2, BKCTRL_3, . . . , BKCTRL_N, set the active period of a redundancy enable signal RRCTRL_EN, and perform an operation in response to the delayed bank control signals D_BKCTRL_1, D_BKCTRL_2, D_BKCTRL_3, . . . , D_BKCTRL_N, during the active period.

The active period of the redundancy enable signal RRCTRL_EN may correspond to a period in which a target row refresh (TRR) operation for a redundancy word line is performed, and the bank control signals BKCTRL_1, BKCTRL_2, BKCTRL_3, . . . , BKCTRL_N may include a control signal for performing a target row refresh (TRR) operation for a redundancy word line, which replaces a failed word line to be repaired.

Although not illustrated in FIG. 2, the redundancy refresh signal RED_REF may be activated in response to a flag signal for refreshing a redundancy word line and an active command.

Figure 3:
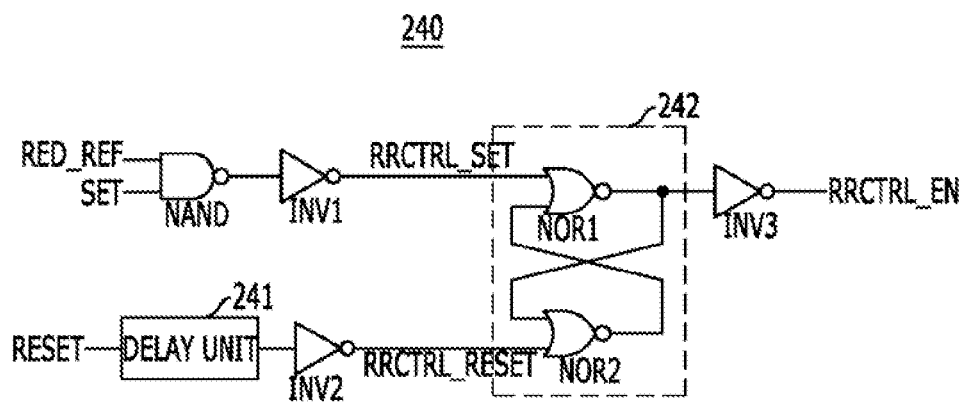
FIG. 3 is a detailed diagram of a redundancy enable signal generation unit shown in FIG. 2.

FIG. 3 is a detailed diagram of the redundancy enable signal generation unit 240 shown in FIG. 2.

Referring to FIG. 3, the redundancy enable signal generation unit 240 may include an SR-latch 242, which operates based on the redundancy refresh signal RED_REF, the set signal SET and the reset signal RESET.

First, the redundancy refresh signal RED_REF and the set signal SET are inputted to a NAND gate NAND, and an inverter INV1 receiving an output signal of the NAND gate NAND generates a redundancy set signal RRCTRL_SET. That is, the redundancy set signal RRCTRL_SET may be activated when both the redundancy refresh signal RED_REF and the set signal SET are activated (i.e., when the set signal SET is activated after the redundancy set signal RRCTRL_SET is activated).

The reset signal RESET may be delayed by a predetermined time through a delay unit 241 and inverted through an inverter INV2, before the reset signal RESET is inputted to the SR-latch 242. The SR-latch 242 may be implemented in a cross-coupled NOR latch including NOR gates NOR1 and NOR2. The reset signal RESET is delayed for compensating a delay amount of the delayed control signals D_BKCTRL_1, D_BKCTRL_2, D_BKCTRL_3, . . . , D_BKCTRL_N, which are delayed through the delay unit 250 shown in FIG. 2. Thus, the reset signal RESET may be delayed by the predetermined time through the delay unit 241 such that the delayed control signals D_BKCTRL_1, D_BKCTRL_2, D_BKCTRL_3, . . . , D_BKCTRL_N are activated within the active period of the redundancy enable signal RRCTRL_EN. Furthermore, the redundancy enable signal RRCTRL_EN may be deactivated in response to a falling edge of the reset signal RESET. The delay unit 241 may have the same configuration as the delay unit 250 shown in FIG. 2.

In other words, a redundancy set signal RRCTRL_SET outputted from the inverter INV1 may set the SR-latch 242, and a redundancy reset signal RRCTRL_RESET outputted from the inverter INV2 may reset the SR-latch 242. The output signal of SR-latch 242 may be inverted and outputted as the redundancy enable signal RRCTRL_EN through a third inverter INV3. Thus, the output redundancy enable signal RRCTRL_EN may be activated in response to the set signal SET, and deactivated at a falling edge of the reset signal RESET such that the active period of the output redundancy enable signal RRCTRL_EN may be adjusted.

Thus, the delayed bank control signals D_BKCTRL_1, D_BKCTRL_2, D_BKCTRL_3, . . . , D_BKCTRL_N outputted from the delay unit 250 of FIG. 2 may be activated between the set signal SET and the reset signal RESET. The delayed control signals D_BKCTRL_1, D_BKCTRL_2, D_BKCTRL_3, . . . , D_BKCTRL_N may be activated within the active period of the redundancy enable signal RRCTRL_EN, to control the bank 210.

Figure 4A:
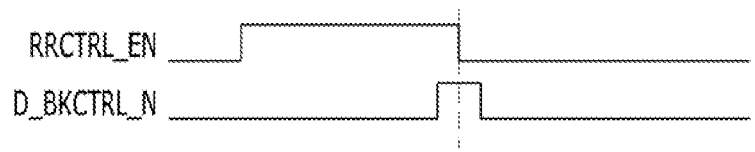
FIG. 4A is a timing diagram for describing are operation of a conventional semiconductor memory.

FIG. 4A is a timing diagram for describing an opera ion of a conventional semiconductor memory.

FIG. 4A indicates a case where a delayed bank control signal D_BKCTRL_N has an active period after a redundancy enable signal RRCTRL_EN is deactivated, due to a PVT variation. The delayed bank control signal D_BKCTRL_N for controlling a redundancy word line needs to be activated within the active period of the redundancy enable signal RRCTRL_EN. However, when the delayed bank control signal D_BKCTRL_N has an active period after the redundancy enable signal RRCTRL_EN is deactivated, a normal word line other than a redundancy word line may be undesirably accessed due to the deactivated redundancy enable signal RRCTRL_EN.

In the present embodiment, the active period of the redundancy enable signal RRCTRL_EN may be adjusted in response to the set signal SET and the reset signal RESET, which are the firstly activated signal and the lastly activated signal, respectively, among the bank control signals BKCTRL_1, BKCTRL_2, BKCTRL_3, . . . , BKCTRL_N. Thus, the delayed bank control signals D_BKCTRL_1, D_BKCTRL_2, D_BKCTRL_3, . . . , D_BKCTRL_N may be operated within the active period of the redundancy refresh signal RED_REF.

Figure 4B:
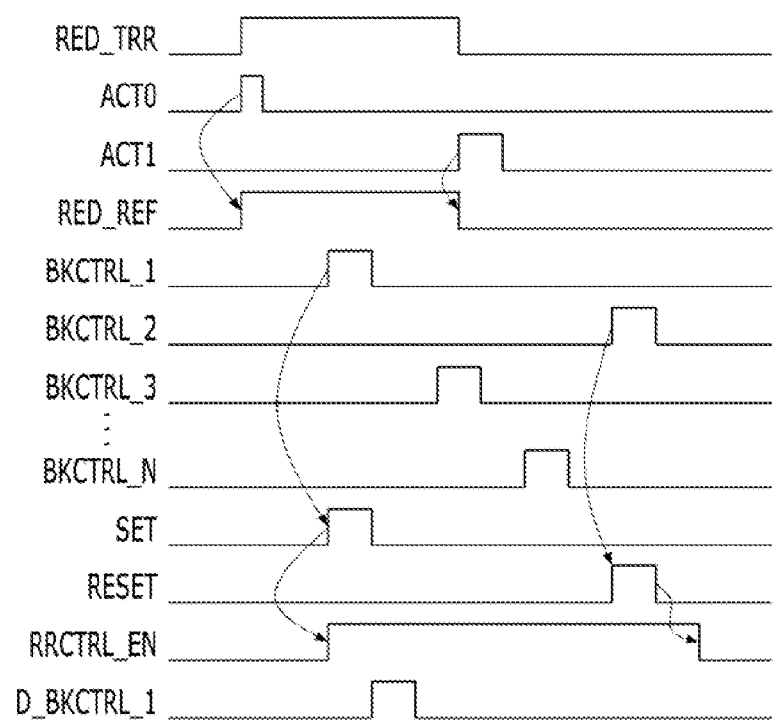
FIG. 4B is a timing diagram for describing an operation of the semiconductor memory shown in FIG. 2.

FIG. 4B is a timing diagram for describing an operation of the semiconductor memory shown in FIG. 2.

Referring to FIGS. 2 and 4B, the redundancy refresh signal RED_REF may be activated when an active command ACT and a flag signal for a target row refresh operation on a redundancy word line are activated. That is, the redundancy refresh signal RED_REF may be activated during the active period of the bank 210 until a next active command ACT1 is inputted after a first active command ACT0 is inputted.

Then, the signal detection unit 230 may detect the first bank control signal BKCTRL_1, which is the firstly activated signal among the bank control signals BKCTRL_1, BKCTRL_2, BKCTRL_3, . . . , BKCTRL_N, as the set signal SET, and detect the second bank control signal BKCTRL_2, which is the lastly activated signal, as the reset signal RESET. According to the set signal SET and the reset signal RESET, the active period of the redundancy enable signal RRCTRL_EN may be adjusted.

The bank control signals BKCTRL_1, BKCTRL_2, BKCTRL_3, . . . , BKCTRL_N for controlling the bank 210 may be delayed by a predetermined time through the delay unit 250. For example, when a firstly activated signal among the bank control signals BKCTRL_1, BKCTRL_2, BKCTRL_3, . . . , BKCTRL_N is the first bank control signal BKCTRL_1, the first bank control signal BKCTRL_1 may be detected as the set signal SET. Thus, the redundancy enable signal RRCTRL_EN may be activated. Then, the first bank control signal BKCTRL_1 may be activated while the redundancy word line is normally enabled.

In the semiconductor memory in accordance with the embodiment of the present invention, the delayed bank control signals D_BKCTRL_1, D_BKCTRL_2, D_BKCTRL_3, . . . , D_BKCTRL_N, which are activated during a period defined by the set signal SET and the reset signal RESET, may be activated within the active period of the redundancy enable signal RRCTRL_EN at all times. Thus, a redundancy word line may be stably controlled despite a PVT variation. For example, a TRR operation may be stably performed to a redundancy word line despite a PVT variation.

In accordance with the embodiments of the present invention, the semiconductor memory may control a memory bank at normal timing even though the bank control signal is distorted due to a PVT variation.

Although various embodiments have been described for illustrative purposes, it will be apparent to those skilled in the art that various changes and modifications may be made without departing from the spirit and scope of the invention as defined in the following claims.

For example, in the embodiment of the present invention, it has been described that cross-coupled NOR gates are used to form an SR-latch. However, the present invention may also be applied to a case in which the NOR gates are replaced with other kinds of logic gates (e.g. NAND gates).

What is claimed is:

1. A semiconductor memory comprising:
    a bank control signal generation unit suitable for sequentially generating a plurality of bank control signals for controlling a memory bank, in response to an active command;
    a signal detection unit suitable for detecting a firstly activated signal and a lastly activated signal among the bank control signals; and
    a bank enable control unit suitable for generating a bank enable signal for controlling an active period of the memory bank in response to the detected signals,
    wherein the bank enable signal is activated in response to the firstly activated signal, and is deactivated in response to the lastly activated signal.

2. The semiconductor memory of claim 1, wherein the signal detection unit comprises:
    a set signal detector suitable for detecting the firstly activated signal, among the bank control signals, as a set signal; and
    a reset signal detector suitable for detecting the lastly activated signal, among the bank control signals, as a reset signal.

3. The semiconductor memory of claim 2, wherein the bank enable control unit comprises an SR-latch suitable for activating the active period of the memory bank in response to the set signal, and deactivating the active period of the memory bank in response to the reset signal.

4. The semiconductor memory of claim 2, wherein the bank enable control unit outputs an enable signal corresponding to the active period of the memory bank in response to the set signal and the reset signal.

5. The semiconductor memory of claim 1, further comprising a delay unit suitable for delaying the bank control signals by a predetermined time.

6. A semiconductor memory comprising:
- a bank control signal generation unit suitable for sequentially generating a plurality of bank control signals for controlling a refresh operation of a memory bank, based on an active command;
- a signal detection unit suitable for detecting a firstly activated signal and a lastly activated signal among the bank control signals; and
- a refresh operation control unit suitable for adjusting a refresh operation period of a refresh signal, in response to the detected signals,
- wherein the refresh signal is activated in response to the firstly activated signal, and is deactivated in response to the lastly activated signal.

7. The semiconductor memory of claim 6, wherein the signal detection unit comprises:
- a set signal detector suitable for detecting the firstly activated signal, among the bank control signals, as a set signal; and
- a reset signal detector suitable for detecting the lastly activated signal, among the bank control signals, as a reset signal.

8. The semiconductor memory of claim 7, wherein the refresh operation control unit comprises an SR-latch suitable for activating the refresh operation period in response to the set signal, and deactivating the refresh operation period in response to the reset signal.

9. The semiconductor memory of claim 7, wherein the refresh operation control unit outputs an enable signal corresponding to the refresh operation period in response to the set signal and the reset signal.

10. The semiconductor memory of claim 6, wherein the refresh operation period comprises a target row refresh operation period for a word line of the memory bank.

11. The semiconductor memory of claim 6, wherein the refresh operation period comprises a refresh operation period for a redundancy word line of the memory bank.

12. The semiconductor memory of claim 6, further comprising a delay unit suitable for delaying the bank control signals by a predetermined time.

13. A method for operating a semiconductor memory, comprising:
- sequentially generating a plurality of control signals for controlling a memory bank, based on an active command;
- generating a set signal in response to a firstly activated signal among the control signals;
- generating a reset signal in response to a lastly activated signal among the control signals; and
- generating a bank enable signal for controlling an active period of the memory bank in response to the control signals,
- wherein the bank enable signal is activated in response to the firstly activated signal, and is deactivated in response to the lastly activated signal.

14. The method of claim 13, wherein the active period of the memory bank comprises a refresh operation period for a word line of the memory bank.

15. The method of claim 13, wherein the refresh operation period of the word line comprises a target row refresh operation period for a word line of the memory bank.

16. The method of claim 13, further comprising delaying the bank control signals by a predetermined time.

* * * * *